(12) United States Patent
Zhang et al.

(10) Patent No.: US 8,365,403 B2
(45) Date of Patent: Feb. 5, 2013

(54) METHOD FOR PROVIDING AN ALTERNATIVE POWER SOURCE FOR A GRAPHICS CARD

(75) Inventors: Tao Zhang, ShenZhen (CN); Zhihui Wang, ShenZhen (CN)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/276,645

(22) Filed: Oct. 19, 2011

(65) Prior Publication Data

US 2012/0036712 A1  Feb. 16, 2012

Related U.S. Application Data

(62) Division of application No. 11/955,317, filed on Dec. 12, 2007, now Pat. No. 8,045,330.

(30) Foreign Application Priority Data

Nov. 29, 2007  (CN) .......................... 2007 1 0195127

(51) Int. Cl.
*H01R 43/00* (2006.01)
*H05K 13/00* (2006.01)

(52) U.S. Cl. ................ 29/854; 29/825; 29/846; 29/850; 716/119; 716/127; 716/137

(58) Field of Classification Search .................... 29/854, 29/402.16, 825, 830, 846, 850; 361/728, 361/736, 813; 716/119, 122, 127, 135, 137
See application file for complete search history.

(56) References Cited

U.S. PATENT DOCUMENTS 6,629,302 B2 *  9/2003  Miura et al. .................. 716/119
6,691,296 B1 *  2/2004  Nakayama et al. ........... 716/122

* cited by examiner

*Primary Examiner* — Thiem Phan
(74) *Attorney, Agent, or Firm* — Patterson & Sheridan, LLP

(57) ABSTRACT

A method for providing an alternative power source for a graphics card are disclosed. Specifically, one embodiment of the present invention sets forth a method, which includes the steps of laying a set of gold fingers on a printed circuit board according to an industrial standard bus interface, positioning a wire in a middle layer of the printed circuit board, attaching a first end of the wire to a specific gold finger, and attaching the alternative power source to a second end of the wire, wherein the second end of the wire is an electroplated contact protruded external to the printed circuit board.

10 Claims, 5 Drawing Sheets

METHOD FOR PROVIDING AN ALTERNATIVE POWER SOURCE FOR A GRAPHICS CARD

CROSS-REFERENCE TO RELATED APPLICATIONS

This application is a divisional of U.S. application Ser. No. 11/955,317 filed Dec. 12, 2007, now U.S. Pat. No. 8,045,330, and which claims the benefit of People's Republic of China Application No. 200710195127.3, filed on Nov. 29, 2007.

BACKGROUND OF THE INVENTION

1. Field of the Invention

The present invention generally relates to an adapter card supporting Peripheral Component Interconnect (PCI) Express bus interface, and more particularly to an apparatus and method for providing an alternative power source to a graphics card.

2. Description of the Related Art

Unless otherwise indicated herein, the approaches described in this first portion are not prior art to the claims in this application and are not admitted to be prior art by inclusion in this section.

A computer system typically includes a dedicated graphics subsystem, such as a graphics card, to render graphics images for the computer system. Peripheral Component Interconnect Express (PCI-E) has been adopted by the industry as the standard bus interface for connecting the graphics card and the motherboard of the computer system.

A typical graphics card 100 includes at least a processing unit, memory unit, and traces on a printed circuit board (PCB). The PCB generally includes multiple layers with the traces (not shown) running through at least the top and bottom layers. The traces are made of connecting materials and are connected to the various components to facilitate signal transmission and power supply. The traces are also connected to gold-plated terminals of a card-edge connector (also referred to as "gold fingers.") To illustrate, FIG. 1A is a simplified schematic diagram showing the conventional graphics card 100 with the PCI-E interface and with a set of gold fingers 110. The gold fingers 110 are divided into a first portion 102 and a second portion 104. Here, the gold fingers in the first portion 102 are primarily responsible for carrying data signals, and the gold fingers in the second portion 104 are primarily responsible for supplying power to the entire graphics card 100. Generally, the graphics card 100 is powered up by connecting a power supply to a dummy pad (not shown). In particular, the dummy pad is connected to the second portion 104 through a wire, so that the electric charges from the power supply flow through the second portion 104. The electric charges are then directed to the first portion 102 from the second portion 104.

One existing solution is to connect the first portion 102 to the second portion 104 using a wire. FIG. 1B is a schematic diagram showing the structure of a conventional gold finger layout and wire connections. Here, each of the first portion 102 and the second portion 104 includes shortened gold fingers 118 and 120, respectively. For the first portion 102, the shortened gold finger 118 resides on a top layer 112 of a PCB. For the second portion 104, the shortened gold finger 120 resides on a bottom layer 116 of the same PCB. The shortened gold fingers serve two purposes. One is to provide a foolproof design, which ensures the proper insertion of the graphics card into a slot, so that connection is secured. The other is to supply power to the graphics card. Both of the shortened gold fingers 118 and 120 are connected to through holes 124 and 126, respectively. The through holes 124 and 126 are cylindrically shaped and with electroplated medium, which is capable of transmitting electrical signals such as power signals. An external power source is connected to a dummy pad 130, which is connected to the shortened gold finger 120 from the second portion 104 on the bottom layer 116. To relay power signal from the second portion 104 to the first portion 102, a wire 128 is used. The wire 128 connects the shortened gold finger 118 of the first portion 102 to the shortened gold finger 120 of the second portion 104. The wire 128 is positioned in a middle layer 114 of the PCB. As shown in FIG. 1B, the wire 128 is connected to the shortened gold finger 120 on the bottom layer 116 via the through hole 126 and is also connected to the shortened gold finger 118 on the top layer 112 via the through hole 124. Positioning the wire 128 in a different layer, as opposed to either on the top layer 112 or the bottom layer 116, helps to reduce signal interferences caused by running the wire 128 across the PCB. However, the problem of signal interferences still can not be removed completely, especially if the strength of the signal traveling on the wire 128 is increased. With signal interferences, the overall quality of the signal transmission, especially at high speed, still suffers.

FIG. 1C is a schematic diagram showing the structure of another conventional gold finger layout and wire connections. Here, a wire 160 is positioned on a top layer 150 of a PCB. A shortened gold finger 154 is positioned on one end of a set of gold fingers 152, which are also positioned on the same top layer 150. The wire 160 is connected from the shortened gold finger 154 on the top layer 150 to a dummy pad 158. The dummy pad 158 generally is positioned close to the location of the shortened gold finger 154 and as discussed above, is often connected to a power supply. In between the shortened gold finger 154 and the dummy pad 158 is a last gold finger 156.

The illustrated configuration has a notable shortcoming. Since the wire 160 is positioned on the top layer 150, a trace 162 connecting to the last gold finger 156, which is also positioned on the same top layer 150, necessarily intersects with the wire 160 connecting between the shortened gold finger 154 and the dummy pad 158. Such an intersection creates an impermissible short circuit. To avoid the short circuit, the last gold finger 156 is in effect rendered useless (i.e., cannot be connected to a trace) but still occupies precious space on the PCB.

As the foregoing illustrates, what is needed is a method and apparatus capable of providing an alternative power source while maintaining the current gold finger layout, and address at least the problems set forth above.

SUMMARY OF THE INVENTION

One embodiment of the present invention sets forth a method, which includes the steps of laying a set of gold fingers on a printed circuit board according to an industrial standard bus interface, positioning a wire in a middle layer of the printed circuit board, attaching a first end of the wire to a specific gold finger, and attaching the alternative power source to a second end of the wire, wherein the second end of the wire is an electroplated contact protruded external to the printed circuit board.

At least one advantage of the present invention disclosed herein is to provide an efficient way to provide power to a PCB and address at least the problems described above.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
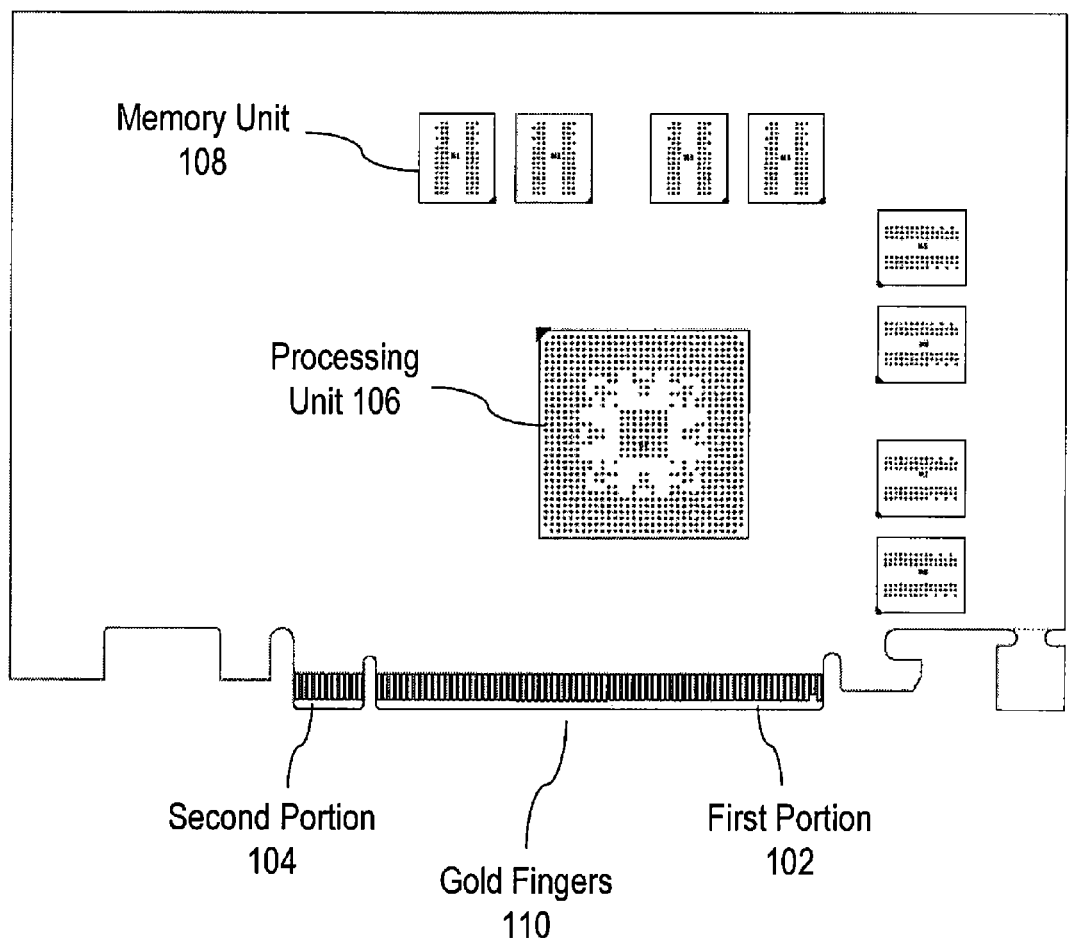
FIG. 1A is a simplified schematic diagram showing a conventional graphics card with the PCI-E interface and with a set of gold fingers.
Figure 1B:
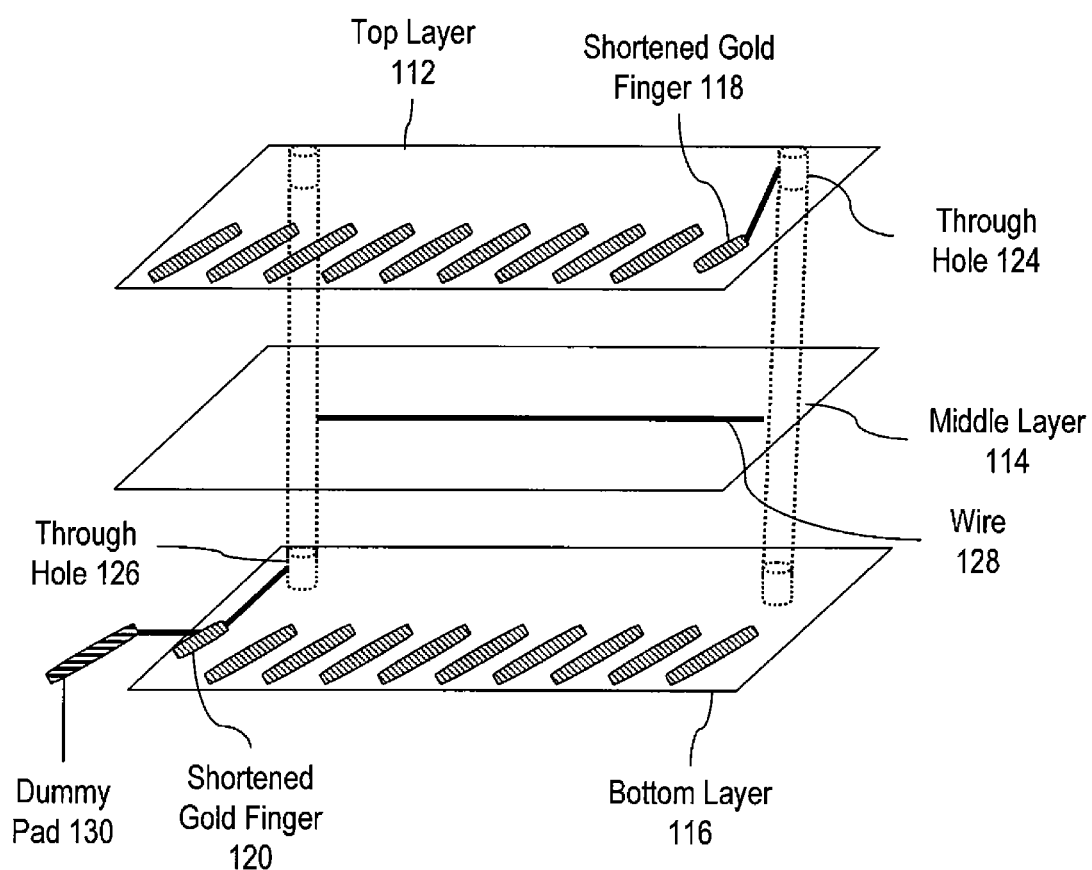
FIG. 1B is a schematic diagram showing the structure of a conventional gold finger layout and wire connections.
Figure 1C:
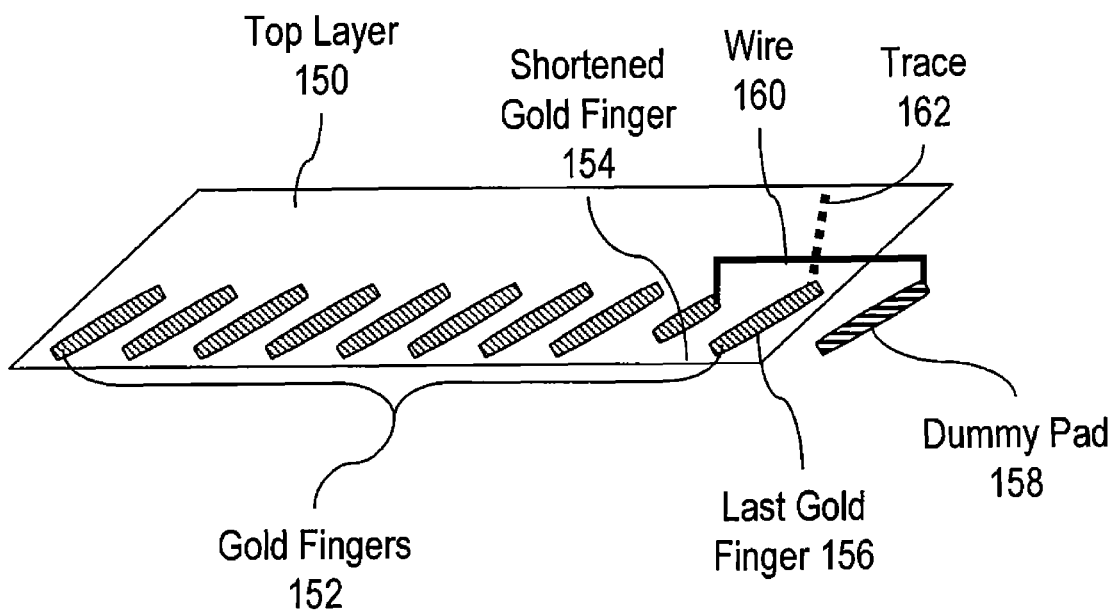
FIG. 1C is a schematic diagram showing the structure of another conventional gold finger layout and wire connections.
Figure 2:
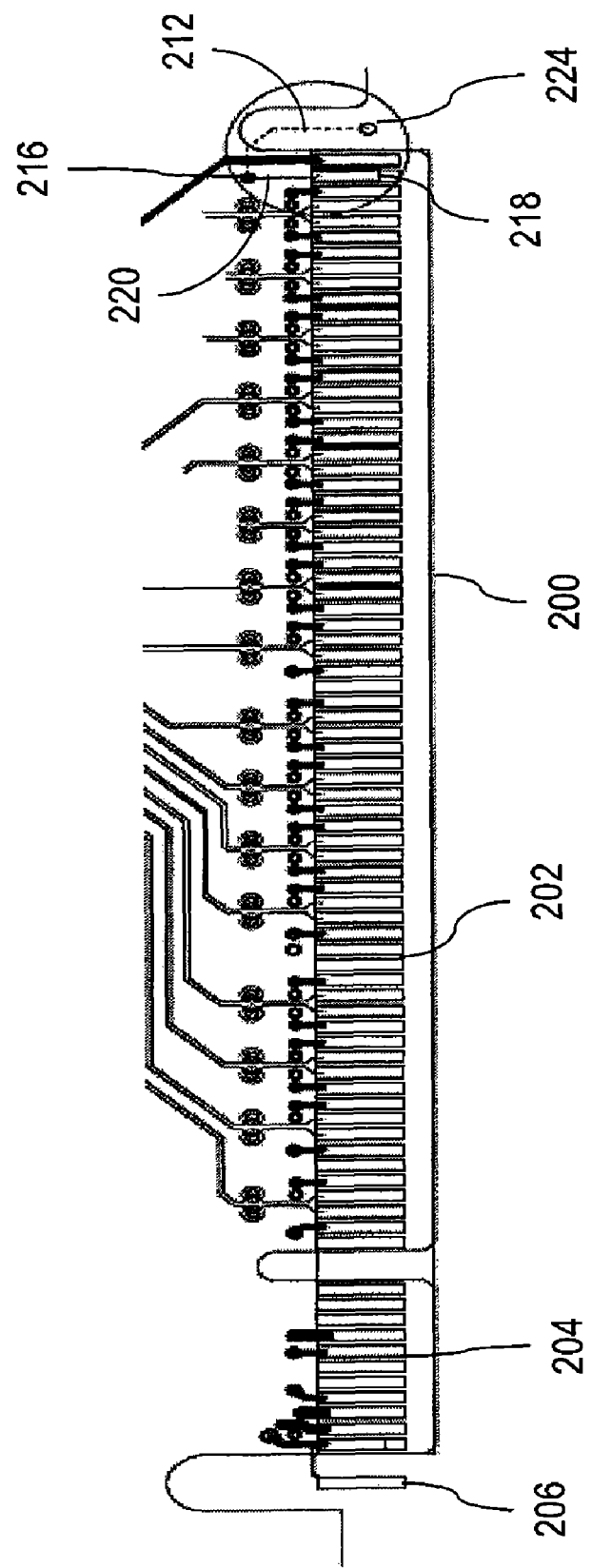
FIG. 2 illustrates a schematic diagram showing a wire connection to an alternative power source in an adapter card, according to one embodiment of the present invention.

FIG. 2 illustrates a schematic diagram showing a wire connection to an alternative power source in an adapter card, according to one embodiment of the present invention. According to the standard PCI-E interface specifications, the gold fingers are divided into two portions, a first portion 202 and a second portion 204 in a PCB 200. The second portion 204 is connected to a power source through a dummy pad 206. The dummy pad 206 is further connected to a shortened gold finger 208 from the second portion 204 on a bottom layer of the adapter card. However, for the first portion 202, an alternative power source (not shown) is provided by directly connecting a wire 212, positioned in a middle layer 214 to this alternative power source. Specifically, by attaching one end of the wire 212 to a through hole 216, which is further connected to a shortened gold finger 218 via a connecting wire 220, the alternative power source is able to supply power signals to the shortened gold finger 218 through the wire 212. On the other end of the wire 212 is an electroplated contact 224 extended out of the PCB 200 and is exposed to the air.

Figure 3:
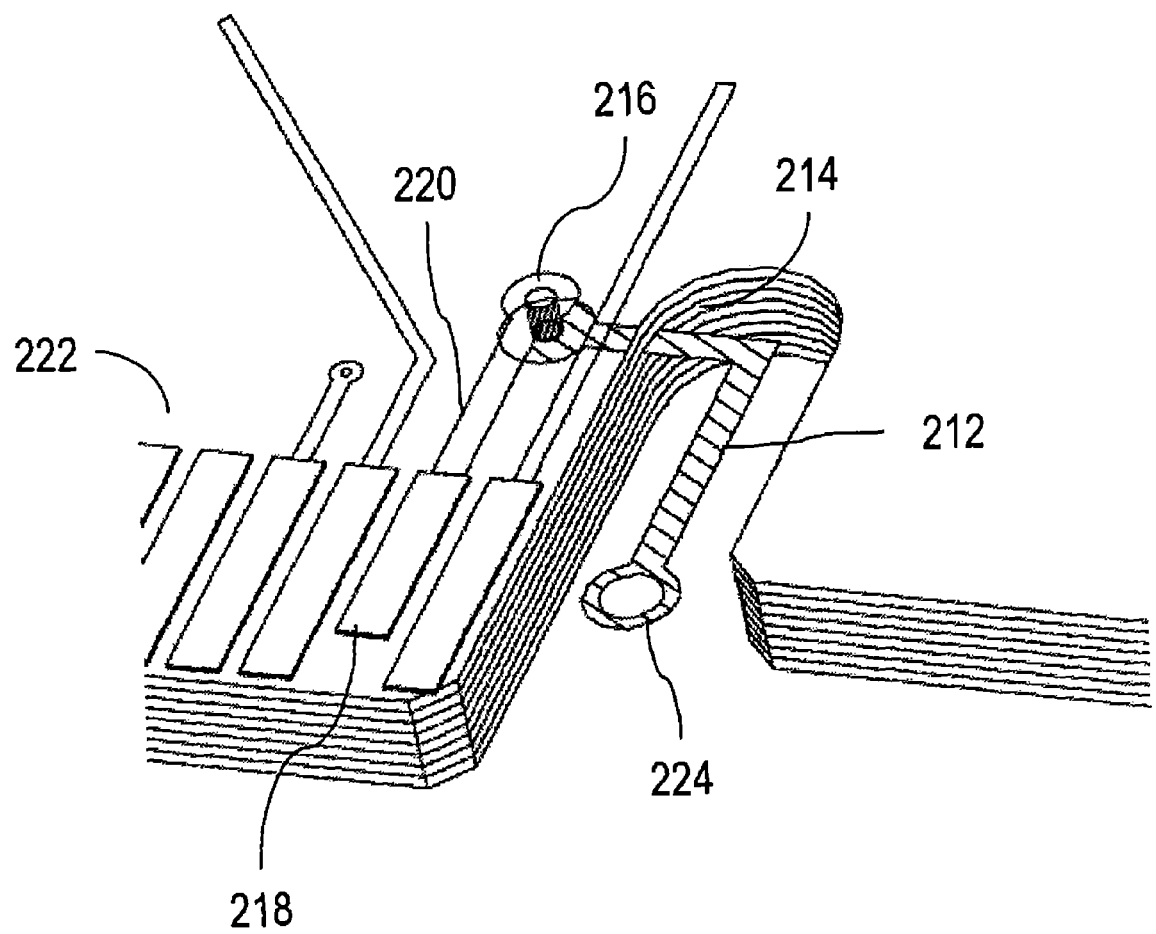
FIG. 3 is a perspective view of the wire connections using a through hole and the different layers of a PCB, according to one embodiment of the present invention.

In conjunction with FIG. 2, to further illustrate the wire connections, FIG. 3 is a perspective view of the wire connections using the through hole 216 and the different layers of the PCB 200, according to one embodiment of the present invention. Specifically, one end of the wire 212 is attached to the through hole 216 in a middle layer 214 of the PCB 200. The through hole 216 is electroplated and is connected to the shortened gold finger 218 on a top layer 222 by the connecting wire 220. While one end of the wire 212 is attached to the through hole 216 in the middle layer 214, the other end of the wire 212 is extended out of the PCB 200 from the middle layer 214. On the other end of the wire 212 is an electroplated contact 224. The contact 224 is circularly shaped and is used to connect with another power source, different from the power source connected to the dummy pad 206 in FIG. 2.

While the foregoing is directed to embodiments of the present invention, other and further embodiments of the invention may be devised without departing from the basic scope thereof, and the scope thereof is determined by the claims that follow.

We claim:

1. A method for providing an alternative power source for a graphics card, comprising:
    laying a set of gold fingers on a printed circuit board according to an industrial standard bus interface;
    positioning a wire in a middle layer of the printed circuit board;
    attaching a first end of the wire to a specific gold finger; and
    attaching the alternative power source to a second end of the wire, wherein the second end of the wire is an electroplated contact protruded external to the printed circuit board.

2. The method of claim 1, further comprising:
    attaching the first end of the wire to a through hole; and
    connecting the through hole to the specific gold finger with a connecting wire, wherein the specific gold finger is shortened.

3. The method of claim 1, wherein the industry standard bus interface is the Peripheral Component Interconnect (PCI) Express bus interface.

4. The method of claim 1, wherein the specific gold finger is a shortened gold finger.

5. The method of claim 1, wherein a first portion of the set of gold fingers is laid on a top layer of the printed circuit board and a second portion of the set of gold fingers is laid on a bottom layer of the printed circuit board.

6. The method of claim 5, wherein the specific gold finger is a shortened gold finger in the first portion.

7. The method of claim 1, further comprising attaching a main power source to a second specific gold finger in the second portion.

8. The method of claim 7, wherein the second specific gold finger is attached to the main power source via a dummy pad.

9. The method of claim 8, wherein the second specific gold finger is a shortened gold finger.

10. The method of claim 1, wherein the electroplated contact is circularly shaped.

* * * * *